（12） United States Patent
Pang et al.

(10) Patent No.: US 6,847,289 B2
(45) Date of Patent: Jan. 25, 2005

(54) DEVICE FOR INITIATING AN OPENING AND LOCKING PROCEDURE OF A MOTOR VEHICLE

(75) Inventors: Peter Pang, Stuttgart (DE); Daniel Schaeffner, Hemmingen (DE); Elmar Giehler, Stuttgart-Hausen (DE); Ulrich Goetz, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/149,833

(22) PCT Filed: Oct. 11, 2001

(86) PCT No.: PCT/DE01/03907

§ 371 (c)(1),
(2), (4) Date: Nov. 7, 2002

(87) PCT Pub. No.: WO02/33203

PCT Pub. Date: Apr. 25, 2002

(65) Prior Publication Data

US 2003/0107473 A1 Jun. 12, 2003

(30) Foreign Application Priority Data

Oct. 14, 2000 (DE) .......................................... 100 51 055

(51) Int. Cl.[7] .............................................. B60R 25/10
(52) U.S. Cl. .......................... 340/426.28; 340/426.13; 340/426.17; 340/426.35; 340/430; 340/5.61; 307/10.1
(58) Field of Search ...................... 340/426.28, 426.13, 340/426.17, 426.35, 426.36, 425.5, 430, 542, 539.23, 825.69, 825.72, 5.61, 5.6, 5.31; 307/9.1, 10.1, 10.3, 10.6; 70/262, 263, 264; 180/271; 341/20, 31, 32, 33

(56) References Cited

U.S. PATENT DOCUMENTS

| 4,763,121 | A | * | 8/1988 | Tomoda et al. ............. 340/5.61 |
| 5,319,364 | A | * | 6/1994 | Waraksa et al. ........... 340/5.64 |
| 5,973,611 | A | * | 10/1999 | Kulha et al. ............... 340/5.62 |
| 6,034,617 | A | * | 3/2000 | Luebke et al. ............. 340/5.62 |
| 6,583,715 | B1 | * | 6/2003 | Benzie et al. .............. 340/5.64 |
| 2001/0052839 | A1 | * | 12/2001 | Nahata et al. ............. 340/5.72 |
| 2001/0054952 | A1 | * | 12/2001 | Desai et al. ............... 340/5.72 |

FOREIGN PATENT DOCUMENTS

| DE | 196 20 059 | 11/1997 |
| DE | 198 05 659 | 3/1999 |
| EP | 0 218 251 | 4/1987 |
| EP | 0 954 098 | 11/1999 |
| WO | WO 97/41322 | 11/1997 |
| WO | WO 01/40606 | 6/2001 |

\* cited by examiner

*Primary Examiner*—Donnie L. Crosland
(74) *Attorney, Agent, or Firm*—Kenyon & Kenyon

(57) ABSTRACT

A device for initiating an opening and locking procedure of a motor vehicle. The device includes a first proximity sensor which generates an unlocking intent signal for initiating an opening procedure of a closing system of a vehicle when a user approaches the first proximity sensor. A second proximity sensor is also provided, generating a locking intent signal for initiating a locking procedure of the closing system of the vehicle when a user approaches the second proximity sensor.

19 Claims, 5 Drawing Sheets

DEVICE FOR INITIATING AN OPENING AND LOCKING PROCEDURE OF A MOTOR VEHICLE

FIELD OF THE INVENTION

The present invention relates to a device for initiating an opening and locking procedure of a motor vehicle.

BACKGROUND INFORMATION

European Patent Application No. 954 098 describes a recognition system which detects the proximity of a person as a function of a change in capacitance of a unit installed in the door handle. In addition, a switch is provided and may be operated by the user in the case of an unregistered change in capacitance in order to initiate a query procedure with an authorization arrangement to acquire access authorization.

It is an object of the present invention to provide a structurally simplified arrangement with which it is possible to achieve both locking and unlocking of the vehicle.

SUMMARY OF THE INVENTION

The device according to the present invention for initiating an opening and locking procedure of a vehicle includes a first proximity sensor, which generates an unlocking intent signal for initiation of an opening operation of a closing system of a vehicle when a user approaches the first proximity sensor. In addition, a second proximity sensor is also provided to generate a locking intent signal for initiation of a locking procedure of the closing system when a user approaches the second proximity sensor. Using two proximity sensors permits accurate differentiation of whether the user would like to initiate an opening or a locking operation of the vehicle. A movable membrane like that of a momentary contact switch for initiating an opening or locking procedure is then no longer necessary. Eliminating switching arrangement to be operated by the user reduces a possible point of attack for vandalism. In the case of a part that is not to be operated mechanically, the lifetime of the arrangement as a whole is increased due to non-wearing contacts. In addition, the proximity sensors may be integrated completely into the door handle, so that the mechanical operability of the arrangement is no longer of primary concern. If the two proximity sensors are integrated into the outside door handle, this greatly facilitates manufacturing. It eliminates tolerance problems that occur in installation of a closing momentary contact switch into the outside door handle. Eliminating momentary contact switches to be operated by the user may also allow complete overpainting of the outside door handle and this increases the degrees of freedom in configuration.

In an example embodiment, the first proximity sensor is situated on the side of the door handle facing the vehicle. If the user wants to unlock the vehicle, he grips the side of the door handle facing the vehicle to open the vehicle door. The approach of the user is thus reliably detected in order to trigger the opening procedure of the closing system.

In an example embodiment, the second proximity sensor is situated on the side of the door handle facing away from the motor vehicle. The user does not usually come in contact with the outside of the door handle when closing the vehicle door. The second proximity sensor thus detects an approach in correspondence with the operating procedure in a reliable manner in order to trigger a locking procedure.

The electrode of the first proximity sensor, the electrode of the second proximity sensor, the analyzer unit of the first and/or second proximity sensor and at least one power supply of at least one analyzer unit are combined in one housing to form one structural unit. This structural unit may be installed easily in the door handle. As an alternative, the power supply processing the battery voltage may be installed in the interior of the vehicle.

In an example embodiment, the two electrodes may be shielded from one another by a ground electrode which is connected to ground and is situated between the two electrodes. The field of each electrode is stopped by the ground electrode, so that the field of the one electrode is not affected by an approach on the other side respectively. This facilitates a unique assignment of the desired activation action.

DETAILED DESCRIPTION

Figure 1:
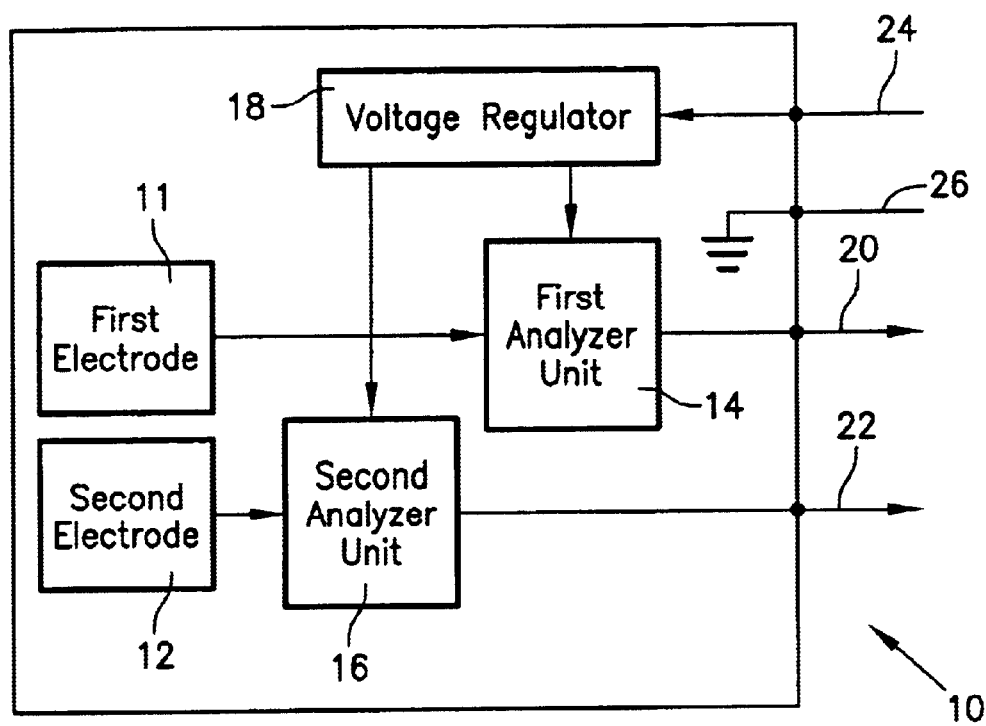
FIG. 1 illustrates a block diagram of an electronic module.

An electronic module 10 includes at least one first electrode 11 the output signal of which is sent to a first analyzer unit 14. First analyzer unit 14 generates an unlocking intent signal 20. A second analyzer unit 16 detects the output signal of second electrode 12 and converts it to a closing intent signal 22. Electronic module 10 receives a power supply voltage 24 and a reference potential 26. A voltage regulator 18 converts power supply voltage 24 into an internal power supply voltage for first analyzer unit 14 and for second analyzer unit 16.

Figure 2:
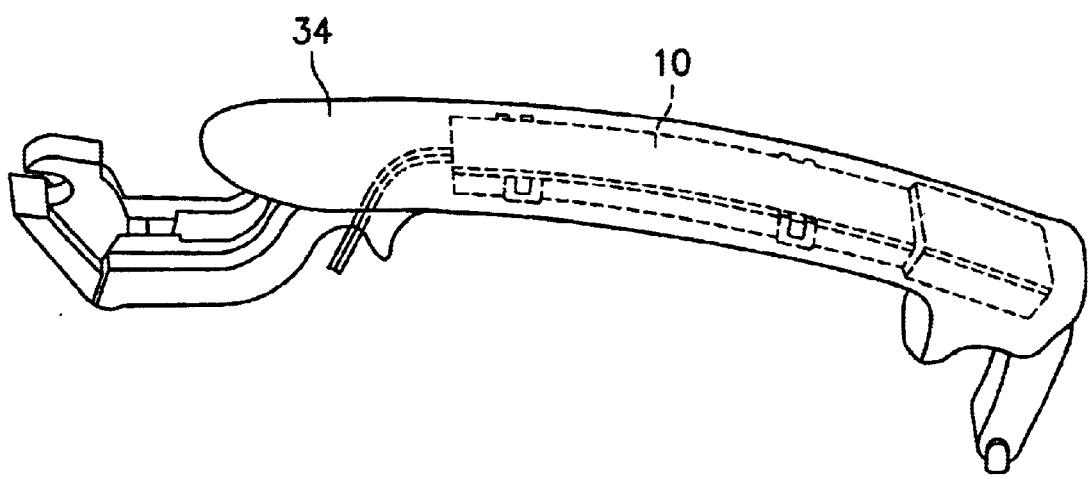
FIG. 2 illustrates the electronic module situated in an outside door handle.
Figure 3:
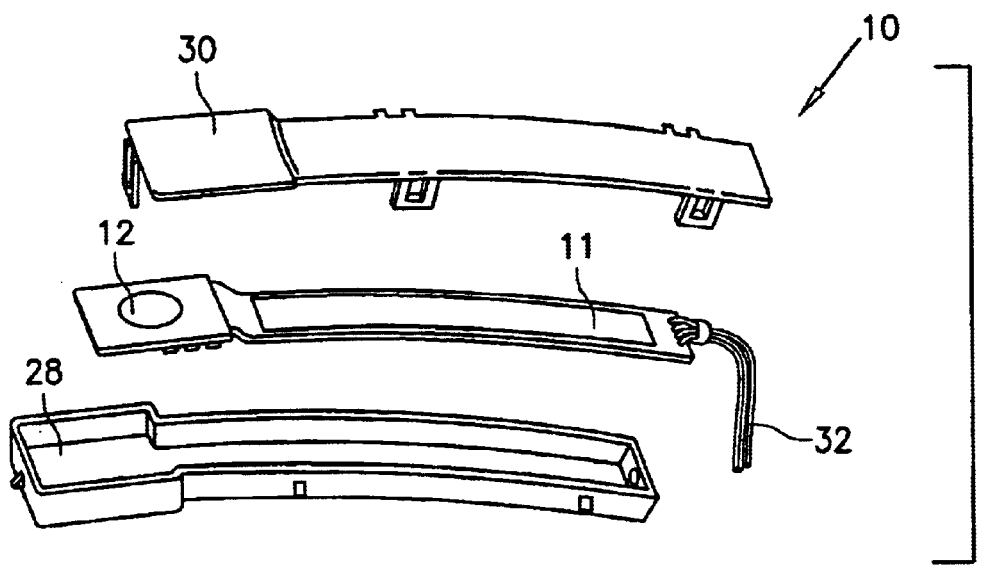
FIG. 3 illustrates the individual components of the electronic module as seen toward the side of the door handle facing away from the motor vehicle.

FIG. 2 illustrates an outside door handle 34 into which electronic module 10 is integrated. According to FIG. 3, electronic module 10 is composed of second electrode 12 in the form of a circle and a first electrode 11 in the form of a rectangle. First electrode 11 and second electrode 12 are situated at different levels from one another, so that first electrode 11 is situated in proximity to the inside of the door handle, but second electrode 12 is situated in proximity to the outside of the door handle when installed. A connecting cable 32 is provided for relaying unlocking intent signal 20 and closing intent signal 22 as well as for supplying power supply voltage 24 as well as reference potential 26. Two electrodes 11, 12 are enclosed in a housing formed by a housing top part 30 and a housing bottom part 28.

Figure 4:
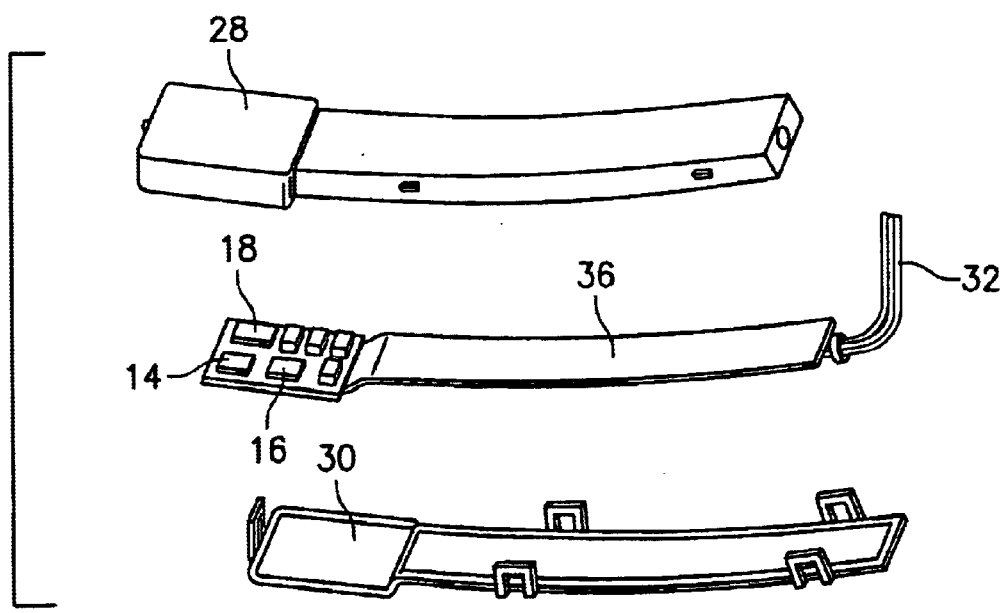
FIG. 4 illustrates the components of the electronic module as seen from the side of the motor vehicle.

The view according to FIG. 4 illustrates that first analyzer unit 14, second analyzer unit 16, and voltage regulator 18 are situated on one side opposite second electrode 12. Again, housing top part 30 and housing bottom part 28 are seen from a perspective opposite that in FIG. 3.

Figure 5:
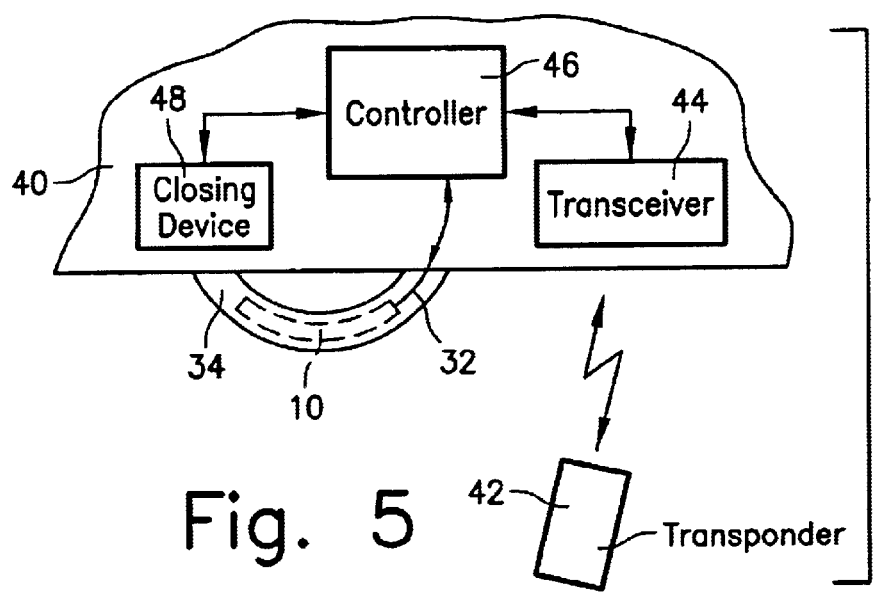
FIG. 5 illustrates a schematic diagram of the overall arrangement of the closing system.

FIG. 5 illustrates a schematic diagram of an overall arrangement. Electrode module 10 is integrated into outside door handle 34 here. Electronic module 10 is connected to a controller 46 via connecting cable 32. A transceiver 44 is situated in the interior of motor vehicle 40 and exchanges authorization data with a transponder 42 that may be carried by a user. Controller 46 controls a closing device 48 of vehicle 40 and optionally receives corresponding acknowledgment signals regarding the status of closing device 48.

Figure 6:
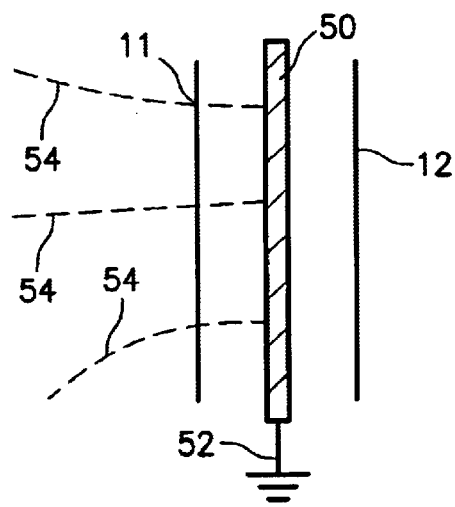
FIG. 6 illustrates another possible electrode arrangement.

According to FIG. 6, a ground electrode 50 is situated between first and second electrodes 11, 12 and is connected to ground 52 as the reference potential. Ground electrode 50 shields the field of first electrode 11, illustrated using field lines 54, from second electrode 12.

Figure 7:
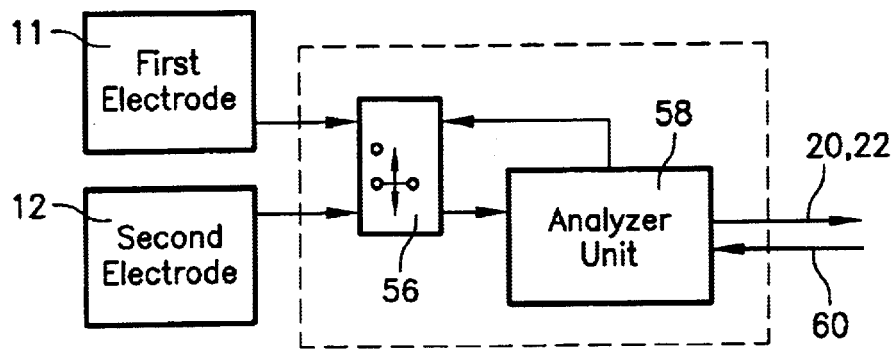
FIG. 7 illustrates an alternative example embodiment.

In the example embodiment according to FIG. 7, output signals of first and second electrodes 11, 12 are sent to a switching arrangement 56 which relays only one of the two signals to an analyzer unit 58. Analyzer unit 58 controls switching arrangement 56 as a function of an input signal 60. Analyzer unit 58 generates an unlocking intent signal 20 or a closing intent signal 22.

Figure 8:
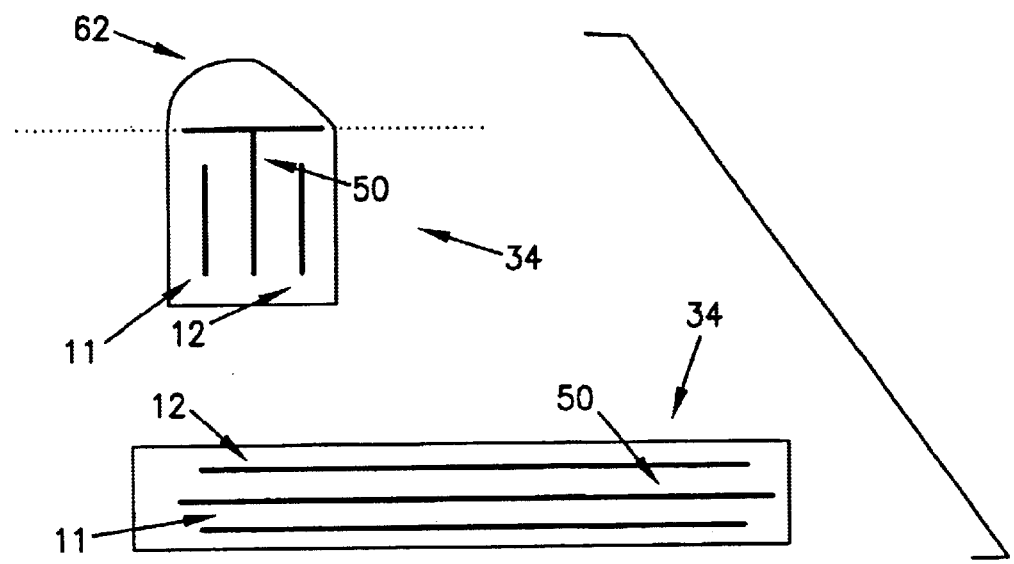
FIG. 8 illustrates another possible arrangement of electrodes in the door handle.

In the example embodiment according to FIG. 8, a ground electrode 50 is situated between two electrodes 11, 12 for clear-cut separation and mutual shielding of the sensor signals of first and second electrodes 11, 12. The cross section of ground electrode 50 is configured in a T shape so that the transverse part of ground electrode 50 is between a metallic decorative cap 62 or decorative coating on door handle 34 and two electrodes 11, 12 and functions as shielding. Crosstalk between two sensors 11, 12 is thus prevented.

Figure 9:
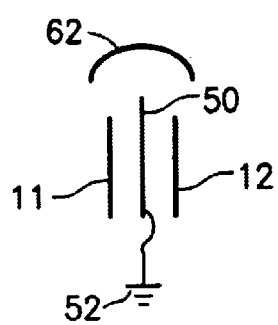
FIG. 9 illustrates an example embodiment including a ground electrode situated between the two electrodes.

According to FIG. 9, the upper arrangement in FIG. 8 is altered so that decorative cap 64 or the decorative metallic coating is electrically contacted to ground 52 just like ground electrode 50. This measure improves the separation of the recognition ranges of the two electrodes 11, 12.

Figure 10:
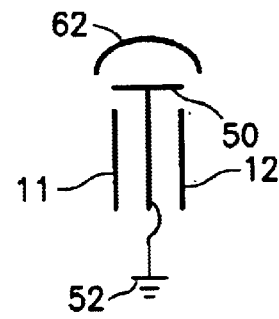
FIG. 10 illustrates an example embodiment including a ground electrode situated between the two electrodes.

The configuration selected in FIG. 10 corresponds to that in FIG. 8. Again, T-shaped ground electrode 52 is also used for shielding both electrodes 11, 12 from one another and from decorative cap 62.

Figures 11A, 11B:
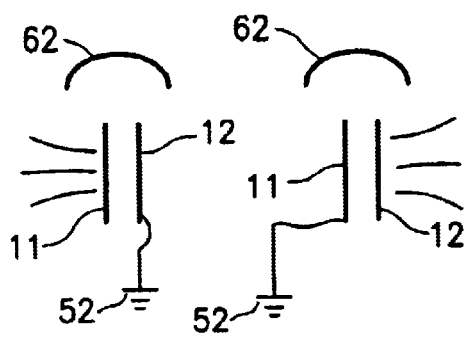
FIG. 11a illustrates an example embodiment including a switchable ground electrode and the respective control according to FIG. 13.
FIG. 11b illustrates an example embodiment including a switchable ground electrode and the respective control according to FIG. 13.

In the example embodiment according to FIGS. 11a, 11b, both electrodes 11, 12 may optionally also be connected to ground 52. If first electrode 11 is also operated as a capacitive proximity sensor, second electrode 12 functions as shielding and therefore is contacted to ground 52 (FIG. 11a). If second electrode 12 is used as a capacitive proximity sensor, first electrode 11, which is then connected to ground 52, also includes a shield (FIG. 11b).

To increase the area of ground electrode 50, ground electrodes 50 are provided between the edge areas of both electrodes 11, 12, connected fixedly to ground 52, optionally again is configured in a T shape for shielding from decorative cap 62 of door handle 34. First and second electrodes 11, 12 may optionally be connected to ground 52 as in the example embodiment according to FIG. 11. It may be advantageous that there is a greater distance between the active sensor electrode and the electrode connected directly to ground 52, while at the same time occupying less space overall.

Figure 13:
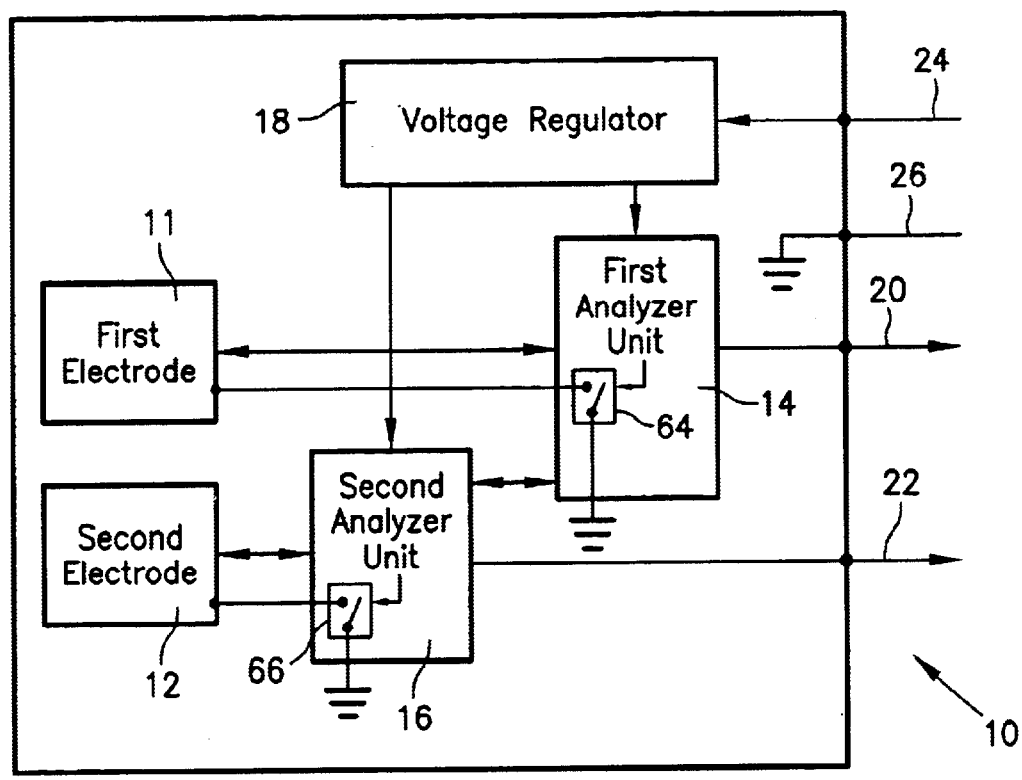
FIG. 13 illustrates the electronic module of FIG. 1 and FIG. 13 differs from FIG. 1 only in that the first analyzer unit includes a first switching arrangement via which the first electrode is connected to a ground electrode.

The example embodiment according to FIG. 13 differs from that in FIG. 1 only in that first analyzer unit 14 includes a first switching arrangement 64 via which first electrode 11 may be connected to ground 52. Second analyzer unit 16 contains a second switching arrangement 66 via which second electrode 12 may be connected to ground 52. In addition, analyzer units 14, 16 communicate with one another to query electrodes 11, 12, for example, always alternating them with a time lag to minimize any mutual influence. This may be accomplished by integration of both analyzer units 14, 16 into a microcontroller, for example.

Capacitive sensors are used as the proximity sensors below. Both electrodes 11, 12 are parts of an arrangement whose capacitance changes significantly on approach of a user. If the change in capacitance exceeds a certain limit, it is concluded that a user is present. For this purpose, respective analyzer units 14, 16 are provided. First electrode 11 is situated in the side of outside door handle 34 which is facing vehicle 40.

The user would then like to operate door handle 34 in the sense of opening it. The approaching hand of the user causes a change in capacitance of the arrangement, including first electrode 11. If the change in capacitance exceeds a certain limit value, first analyzer unit 14 generates an unlocking intent signal 20, which is relayed to controller 46 over connecting cable 32. Controller 46 then initiates an authorization query. A user is identified as authorized using a transponder 42 carried by the user. Transmitter 44 here sends a query signal to transponder 42 which calculates a response signal and sends it back to receiver 44. If the response signal sent back by transponder 42 corresponds to a response signal calculated by controller 46, it is concluded that this is an authorized user. Controller 46 generates an opening command for closing device 48. Vehicle 40 is unlocked. However, if the expected response signal does not match the response signal received, the user does not gain access authorization to vehicle 40. Closing device 48 remains locked.

If the user approaches second electrode 12 to initiate a closing operation of vehicle 40, second response unit 16 recognizes, on the basis of the change in capacitance, that a user is in proximity to second electrode 12. Then a closing intent signal 22 is generated and relayed to controller 46 via connecting cable 32. Controller 46 either repeats the authorization procedure, as run through in unlocking vehicle 40, or immediately sends a closing command to closing device 48.

If analyzer units 14, 16 have generated both an unlocking intent signal 20 and a closing intent signal 22, controller 46 analyzes only the signal that would result in a change in the closing state of closing device 48. The condition of closing device 48 is known to controller 46 via corresponding acknowledgment signals of closing device 48. Therefore, when vehicle 40 is locked, only unlocking intent signal 20 would result in a respective control, but the arrival of a closing intent signal 22 would not.

In the example embodiment according to FIG. 1, a voltage regulator is provided, generating from the battery voltage, i.e., power supply voltage 24, an internal voltage of 5 V, for example, which supplies both analyzer units 14, 16. Separate, independently activatable voltage regulators 18 may also be provided for each analyzer unit 14, 16. A control signal to activate or deactivate voltage regulator 18 may be transmitted over an additional cable or in encoded form on an existing cable, e.g., that of the power supply voltage 24.

Both analyzer units 14, 16 may differ by their zero signal current demands, their sensitivities, or their response rates in order to thereby adapt to the respective situation (opening, closing). It may be possible for respective analyzer unit 14, 16 to be activated or deactivated as a function of the status of closing device 48 or to be switched to idle mode. If vehicle 40 is locked, for example, only an unlocking intent, which may be triggered only via first electrode 11, may be expected. Thus the second analyzer unit, which could result only in generation of a closing intent signal 22 for locking vehicle 40, may be deactivated. Second analyzer unit 16 could then be activated, for example, only if, after deactivation of vehicle 40, the driver's door has first been opened and closed. This makes it possible to reduce the zero signal current demand of the overall arrangement.

First electrode 11 is rectangular in shape so as to correspond to the expected gripping area of a user's hand. Second electrode 12 for detecting a closing intent is configured as a circle or ellipse and has dimensions such that it reliably detects the approach of a finger, e.g., the thumb. Different electrode shapes thus take into account the different operating procedures. Printed conductors of electronic module 10, for example, may be used as electrodes 11, 12. Circuit board 36 on which electrodes 11, 12 as well as both analyzer units 14, 16 and voltage regulator 18 are situated is encased by a housing composed of housing top part 30 and housing bottom part 28. Connecting cable 32 to the interior of the vehicle passes across a recess.

In the example embodiment according to FIG. 6 both electrodes 11, 12 are functionally separated by a ground electrode 50 introduced between both electrodes 11, 12. Thus the field assigned to first electrode 11 does not go further than to ground electrode 50, as illustrated by field lines 54, so that second electrode 12 is unable to detect a field which has been influenced by the approach of a user to first electrode 11. The mutual separation of electrodes 11, 12 might be implemented by a multilayer circuit board 36, for example.

In an alternative example embodiment according to FIG. 7, only one analyzer unit 58 is provided for two electrodes 11, 12. Switching arrangement 56 ensures that either the output signal of first electrode 11 or the output signal of second electrode 12 of analyzer unit 58 is made available. Switching arrangement 56 is controlled in such a manner that the output signal is always the output signal of electrode 11, 12 whose proximity recognition would result in a change in the state of closing system 8. In the locked state, switching arrangement 56 relays the output signal of first electrode 11, and in the unlocked state it relays the output signal of second electrode 12. The corresponding information regarding the locked state of closing system 48 goes via input signal 60 to analyzer unit 58, which converts it to corresponding activation of switching arrangement 56. Switching arrangement 56 and analyzer unit 58 may be combined in one structural unit. Activation of switching arrangement 56 could also be achieved directly via input signal 60. Thanks to the arrangement described here, it is possible to further reduce the complexity of the components.

The example embodiments according to FIGS. 8 through 13 ensure an improved isolation of first and second electrodes 11, 12 even in the case of a spatially tight arrangement of sensor electrodes 11, 12. This also reduces interference effects of configuration elements on door handle 34 such as electrically conducting chrome trim plates, chrome covers or decorative coatings. Crosstalk between two electrodes 11, 12 may also be prevented by having both electrodes 11, 12 queried in mutual coordination. This is achieved first by situating a ground electrode 50, which is connected to ground 52 as the possible reference potential, between first and second electrodes 11, 12. To minimize interfering effects with respect to electrically conducting configuration elements 62 of door handle 34, ground electrode 50 is also situated between these configuration elements 62 and two electrodes 11, 12. Configuration elements 62 may themselves be electroconductively connected to ground 52.

Figures 12A, 12B:
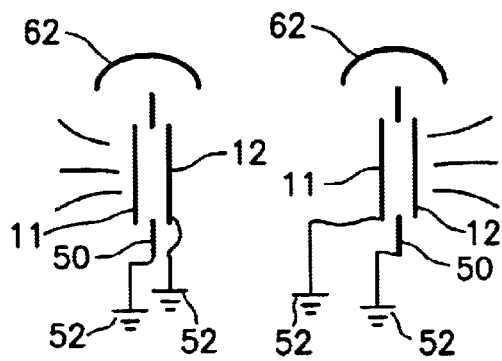
FIG. 12a illustrates an example embodiment including a switchable ground electrode and the respective control according to FIG. 13.
FIG. 12b illustrates an example embodiment including a switchable ground electrode and the respective control according to FIG. 13.

According to the example embodiments illustrated in FIGS. 11 through 13, one of electrodes 11, 12 is used as a proximity sensor and the other as a screening electrode. In FIGS. 11a, 12a, second switching arrangement 66, which is now closed, connects second electrode 12 to ground, while first switching arrangement 64 remains open. In FIGS. 11b, 12b, first switching arrangement 64 is closed, so that first electrode 11 is connected to ground 52. Second analyzer unit 16, however, controls second switching arrangement 66 in the sense of opening it and determines the capacitance of second electrode 12 to detect an approach of someone to second electrode 12. According to FIG. 13, a bidirectional communication option between two analyzer units 14, 16 is also provided. This is used for a mutually coordinated, time-delay query of two electrodes 11, 12. The mutual influence of both electrodes 11, 12 is reduced. This may be achieved, e.g., by integration of two analyzer units 14, 16 into a microcontroller.

Figure 14:
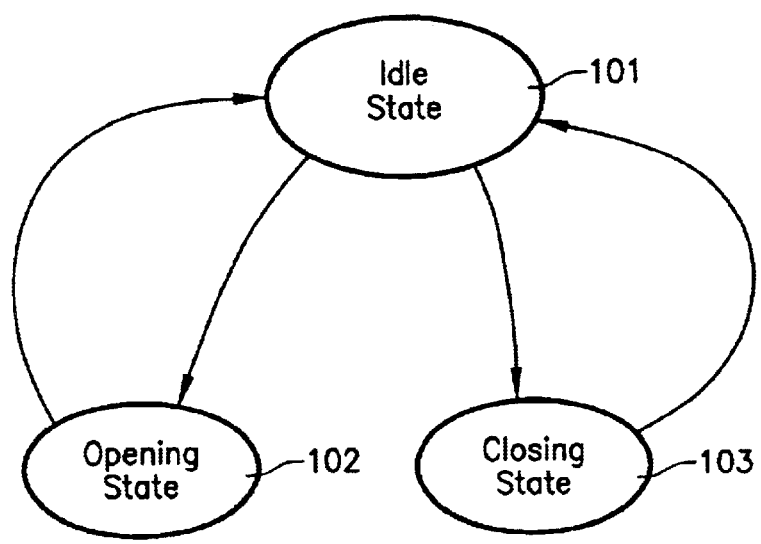
FIG. 14 illustrates a flow chart.

Despite field shaping and isolation, there is still a certain risk of triggering both sensors or electrodes 11, 12 when handle 34 is gripped. Due to the arrangement and isolation, however, sensor 11, 12, which triggers a signal corresponding to the operating intent, is activated first. To prevent problems in analysis, it is possible to implement a logic which may allow only the first signal to pass through and then blocks, the second signal. This blocking is canceled again when both sensors 11, 12 no longer register an approach. FIG. 14 illustrates the respective flow chart. The system is at idle in state 101. It switches to state 102 when first electrode 11 has delivered an opening signal. Unlocking intent signal 20 is output in state 102. A change to idle state 101 occurs only when sensors 11, 12 have not delivered either an opening signal or a closing signal. State 103 is achieved from idle state 101 only when a closing signal is detected. Closing intent signal 22 is output in state 103. The change to idle state 101 occurs only when neither a closing signal nor an opening signal is detected. This processing could also be executed in the on-board controller.

Electrodes 11, 12 may be part of a multilayer circuit board also containing analyzer units 14, 16, for example.

The functioning of the proximity sensor is not limited to the capacitance analysis principle. Suitable no-contact detection systems also include principles based on ultrasound, infrared, electromagnetic waves (radar principle), etc.

What is claimed is:

1. A device for initiating an opening and locking procedure of a motor vehicle, comprising:
   a first proximity sensor which generates an unlocking intent signal for initiating an opening procedure of a closing system of the motor vehicle when a user approaches the first proximity sensor; and a second proximity sensor which generates a closing intent signal for initiating a locking procedure of the closing system of the motor vehicle when the user approaches the second proximity sensor.

2. The device according to claim 1, wherein:
the first proximity sensor and the second proximity sensor each includes at least one electrode, an approach being detected by an analysis of a capacitance.

3. The device according to claim 1, wherein:
at least one of the first proximity sensor and the second proximity sensor is arranged in an outside door handle.

4. The device according to claim 1, wherein:
the first proximity sensor is arranged on a side of an outside door handle which is facing the motor vehicle.

5. The device according to claim 1, wherein:
the second proximity sensor is arranged on a side of an outside door handle which is facing away from the motor vehicle.

6. The device according to claim 1, further comprising:
a common circuit board on which is arranged the first proximity sensor and the second proximity sensor.

7. The device according to claim 1, further comprising:
a power supply, wherein:
the first proximity sensor includes a first analyzer unit,
the second proximity sensor includes a second analyzer unit, and
the power supply supplies power to the first analyzer unit and the second analyzer unit.

8. The device according to claim 7, further comprising:
a housing, wherein:
the first proximity sensor includes a first electrode,
the second proximity sensor includes a second electrode, and
the first analyzer unit, the first electrode, the second analyzer unit, the second electrode, and the power supply are arranged in the housing.

9. The device according to claim 1, wherein:
an authorization query is initiated with a transponder carried by the user upon arrival of at least one of the unlocking intent signal and the closing intent signal.

10. The device according to claim 8, wherein:
at least one of an analysis of a signal of the first electrode and a generation of the unlocking intent signal is performed only when the closing system is in a locked state.

11. The device according to claim 8, further comprising:
at least one switching arrangement relaying one of an output signal of the first electrode and an output signal of the second electrode to another analyzer unit.

12. The device according to claim 11, wherein:
the at least one switching arrangement is controlled as a function of a status of the closing system.

13. The device according to claim 1, further comprising:
a reference potential electrode connected to a reference potential and for providing a shielding.

14. The device according to claim 13, wherein:
the reference potential electrode is arranged between a first electrode of the first proximity sensor and a second electrode of the second proximity sensor.

15. The device according to claim 13, wherein:
the reference potential electrode is arranged between at least one of a first electrode of the first proximity sensor and a second electrode of the second proximity sensor and an electrically conducting layer on an outside door handle.

16. The device according to claim 13, wherein:
at least one of the first electrode and the second electrode is electroconductively connectable to the reference potential.

17. The device according to claim 8, wherein:
the first electrode and the second electrode are controlled at different points in time relatively to each other.

18. The device according to claim 8, wherein:
in the event of triggering of the first electrode and the second electrode, only a signal of the one of the first electrode and the second electrode which was triggered first is relayed.

19. The device according to claim 8, wherein:
a new signal of the first electrode and the second electrode is relayed only if neither the first electrode or the second electrode previously detected an approach of a person.

* * * * *